United States Patent
Hu et al.

(10) Patent No.: US 10,418,480 B2
(45) Date of Patent: Sep. 17, 2019

(54) SEMICONDUCTOR DEVICE CAPABLE OF HIGH-VOLTAGE OPERATION

(71) Applicant: MEDIATEK INC., Hsin-Chu (TW)

(72) Inventors: Chu-Wei Hu, Zhubei (TW); Cheng Hua Lin, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/426,414

(22) Filed: Feb. 7, 2017

(65) Prior Publication Data

US 2017/0263761 A1    Sep. 14, 2017

Related U.S. Application Data

(60) Provisional application No. 62/401,284, filed on Sep. 29, 2016, provisional application No. 62/382,804, (Continued)

(51) Int. Cl.
*H01L 29/78* (2006.01)
*H01L 21/28* (2006.01)
(Continued)

(52) U.S. Cl.
CPC .... *H01L 29/7816* (2013.01); *H01L 21/28008* (2013.01); *H01L 21/28518* (2013.01);
(Continued)

(58) Field of Classification Search
CPC ............... H01L 29/7816; H01L 29/404; H01L 29/7831; H01L 29/66681; H01L 29/402
See application file for complete search history.

(56) References Cited

U.S. PATENT DOCUMENTS

| 4,811,078 A | 3/1989 | Tigelaar et al. |
| 5,393,691 A | 2/1995 | Hsu et al. |
| (Continued) | | |

FOREIGN PATENT DOCUMENTS

| CN | 102569079 B | 12/2014 |
| JP | H09237841 A | 9/1997 |
| WO | WO 2012/147456 A1 | 11/2012 |

OTHER PUBLICATIONS

U.S. Appl. No. 15/411,009, filed Jan. 20, 2017, Lin et al.
U.S. Appl. No. 15/425,207, filed Feb. 6, 2017, Lin et al.

*Primary Examiner* — Charles D Garber
*Assistant Examiner* — S M Sohel Imtiaz
(74) *Attorney, Agent, or Firm* — Wolf, Greenfield & Sacks, P.C.

(57) ABSTRACT

A semiconductor device capable of high-voltage operation includes a semiconductor substrate having a first conductivity type. A first well doped region is formed in the semiconductor substrate, having a second conductivity type that is the opposite of the first conductivity type. A first doped region and a second doped region are formed on the first well doped region, having the second conductivity type. A first gate structure is formed over the first well doped region and adjacent to the first doped region. A second gate structure overlaps the first gate structure and the first well doped region. A third gate structure is formed beside the second gate structure and close to the second doped region. The top surface of the first well doped region between the second gate structure and the third gate structure avoids having any gate structure and silicide formed thereon.

24 Claims, 7 Drawing Sheets

Related U.S. Application Data filed on Sep. 2, 2016, provisional application No. 62/306,661, filed on Mar. 11, 2016.

(51) Int. Cl.

| | |
|---|---|
| *H01L 21/285* | (2006.01) |
| *H01L 29/40* | (2006.01) |
| *H01L 29/423* | (2006.01) |
| *H01L 29/66* | (2006.01) |
| *H01L 29/10* | (2006.01) |

(52) U.S. Cl.
CPC .......... *H01L 29/402* (2013.01); *H01L 29/404* (2013.01); *H01L 29/42356* (2013.01); *H01L 29/42376* (2013.01); *H01L 29/66681* (2013.01); *H01L 29/7831* (2013.01); *H01L 29/1083* (2013.01)

(56) References Cited

U.S. PATENT DOCUMENTS

| | | | |
|---|---|---|---|
| 6,448,611 B1 | 9/2002 | Oh | |
| 6,710,416 B1 | 3/2004 | Xu | |
| 6,825,531 B1 | 11/2004 | Mallikarjunaswamy | |
| 9,761,657 B2 | 9/2017 | Hsiao et al. | |
| 10,199,496 B2 | 2/2019 | Lin et al. | |
| 2004/0021182 A1* | 2/2004 | Green | H01L 29/405 257/409 |
| 2005/0253167 A1* | 11/2005 | Wu | H01L 29/402 257/192 |
| 2005/0253168 A1* | 11/2005 | Wu | H01L 29/404 257/192 |
| 2007/0007591 A1 | 1/2007 | Theeuwen et al. | |
| 2007/0096205 A1 | 5/2007 | Ko et al. | |
| 2008/0014690 A1* | 1/2008 | Chu | H01L 29/66659 438/197 |
| 2008/0070371 A1 | 3/2008 | Wang | |
| 2011/0260247 A1 | 10/2011 | Yang et al. | |
| 2012/0068772 A1* | 3/2012 | Murad | H01L 29/402 330/296 |
| 2012/0126323 A1 | 5/2012 | Wu et al. | |
| 2012/0211832 A1* | 8/2012 | Chu | H01L 29/402 257/335 |
| 2013/0020632 A1* | 1/2013 | Disney | H01L 29/402 257/328 |
| 2013/0146973 A1 | 6/2013 | Mitra et al. | |
| 2013/0320432 A1 | 12/2013 | Ng et al. | |
| 2014/0167171 A1 | 6/2014 | Kaya et al. | |
| 2015/0123199 A1* | 5/2015 | Chen | H01L 29/66681 257/339 |
| 2015/0194494 A1* | 7/2015 | Ahn | H01L 29/402 257/409 |
| 2015/0236150 A1 | 8/2015 | Chen et al. | |
| 2016/0093729 A1 | 3/2016 | Wang et al. | |
| 2016/0172490 A1 | 6/2016 | Lao et al. | |
| 2017/0077250 A1 | 3/2017 | Hsiao et al. | |
| 2017/0077293 A1 | 3/2017 | Chien et al. | |
| 2017/0110536 A1 | 4/2017 | Hsiao et al. | |
| 2017/0229570 A1 | 8/2017 | Cheng et al. | |
| 2017/0263717 A1 | 9/2017 | Lin et al. | |
| 2017/0263761 A1 | 9/2017 | Hu et al. | |
| 2017/0263764 A1 | 9/2017 | Lin et al. | |

* cited by examiner

SEMICONDUCTOR DEVICE CAPABLE OF HIGH-VOLTAGE OPERATION

CROSS REFERENCE TO RELATED APPLICATIONS

This application claims the benefit of U.S. Provisional Application No. 62/306,661 filed on Mar. 11, 2016, U.S. Provisional Application No. 62/382,804 filed on Sep. 2, 2016 and U.S. Provisional Application No. 62/401,284 filed on Sep. 29, 2016, the entirety of which are incorporated by reference herein.

BACKGROUND OF THE INVENTION

Field of the Invention

The present invention relates to integrated circuits (ICs), and in particular to semiconductor devices capable of high-voltage operation and methods for forming the same.

Description of the Related Art

Recently, as demand has increased for high-voltage devices such as power semiconductor devices, there has been an increasing interest in research on high-voltage metal-oxide-semiconductor field effect transistors (HV MOSFETs) applied in high-voltage devices.

Among the various types of high-voltage metal-oxide-semiconductor field effect transistors (HV MOSFETs), semiconductor devices such as lateral double diffused metal-oxide-semiconductor (LDMOS) devices are often used.

However, with progress being made in semiconductor fabrication, the breakdown voltage of high-voltage MOSFETs for high-voltage devices needs to be increased further. Thus, a reliable high-voltage MOSFET for high-voltage devices having an increased breakdown voltage is needed to meet device performance requirements as the needs of semiconductor fabrication of high-voltage devices continue.

BRIEF SUMMARY OF THE INVENTION

An exemplary embodiment of a semiconductor device is provided. The semiconductor device includes a semiconductor substrate having a first conductivity type. A first well doped region is formed in a portion of the semiconductor substrate, having a second conductivity type that is the opposite of the first conductivity type. A first doped region is formed on the first well doped region, having the second conductivity type. A second doped region is formed on the first well doped region and separated from the first doped region, having the second conductivity type. A first gate structure is formed over the first well doped region and adjacent to the first doped region. A second gate structure overlaps a portion of the first gate structure and a portion of the first well doped region. A third gate structure is formed beside the second gate structure and close to the second doped region. A top surface of the first well doped region between the second gate structure and the third gate structure avoids having any gate structure and silicide formed thereon.

Another exemplary embodiment of a semiconductor device includes a semiconductor substrate having a first conductivity type. A first well doped region is formed in a portion of the semiconductor substrate, having a second conductivity type that is the opposite of the first conductivity type. A first doped region is formed on the first well doped region, having the second conductivity type. A second doped region is formed on the first well doped region and separated from the first doped region, having the second conductivity type. A first gate structure is formed over the first well doped region and adjacent to the first doped region. A second gate structure overlaps a portion of the first gate structure. A third gate structure is formed beside the second gate structure and close to the second doped region. The second gate structure has a first sidewall and a second sidewall opposite to the first sidewall. The first sidewall is positioned directly on the top surface of the first gate structure, and the second sidewall extends below the top surface of the first gate structure.

Yet another exemplary embodiment of a semiconductor device includes a semiconductor substrate having a first conductivity type. A first well doped region is formed in a portion of the semiconductor substrate, having a second conductivity type that is the opposite of the first conductivity type. A source doped region is formed on the first well doped region, having the second conductivity type. A drain doped region is formed on the first well doped region and separated from the first doped region, having the second conductivity type. A gate structure is formed on the first well doped region and close to the source doped region. A first field plate gate structure is formed covering and electrically coupled to the gate structure. A second field plate gate structure is separated from the first field plate gate structure and close to the drain doped region. The first field plate gate structure has a first bottom corner that is close to the second field plate gate structure and lower than the top surface of the gate structure.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments provide a semiconductor device, for example, a power MOS. The semiconductor device uses at least two field plate gate structures to extend a lateral distance between a gate structure and a drain doped region of the power MOS transistor. The lateral distance is along a direction substantially parallel to a top surface of a semiconductor substrate. The spacing between the field plate gate structures is designed to be small enough to avoid having any silicide formed in the spacing. Therefore, no dummy gate structure is required to be formed covering the bottom of the spacing to block the formation of the silicide. The field plate gate structure close to the source doped region is electrically coupled to the gate structure of the power MOS. The field plate gate structure close to the drain doped region may be electrically coupled to the gate structure and separated from the drain doped region be another dummy gate structure. Alternatively, the field plate gate structure close to the drain doped region may be electrically floating and adjacent to the drain doped region. A more uniform electric field contribution can be observed in a channel region (a region between a source doped region and the drain doped region) and a higher breakdown voltage (BVD) is obtained during operation of the of the power MOS transistor.

FIGS. 1-6 are schematic cross-sectional views showing an intermediate stage of a method for forming a semiconductor device 500a in accordance with some embodiments of the disclosure. The semiconductor device 500a shown in FIG. 6 formed by the method shown in FIGS. 1-6 comprises a high-voltage metal-oxide-semiconductor field effect transistor (HV MOSFET) capable of high-voltage (e.g. 100 volts or above) operations. For example, the HV MOSFET can be a power metal-oxide-semiconductor (MOS) transistor.

Figure 1:
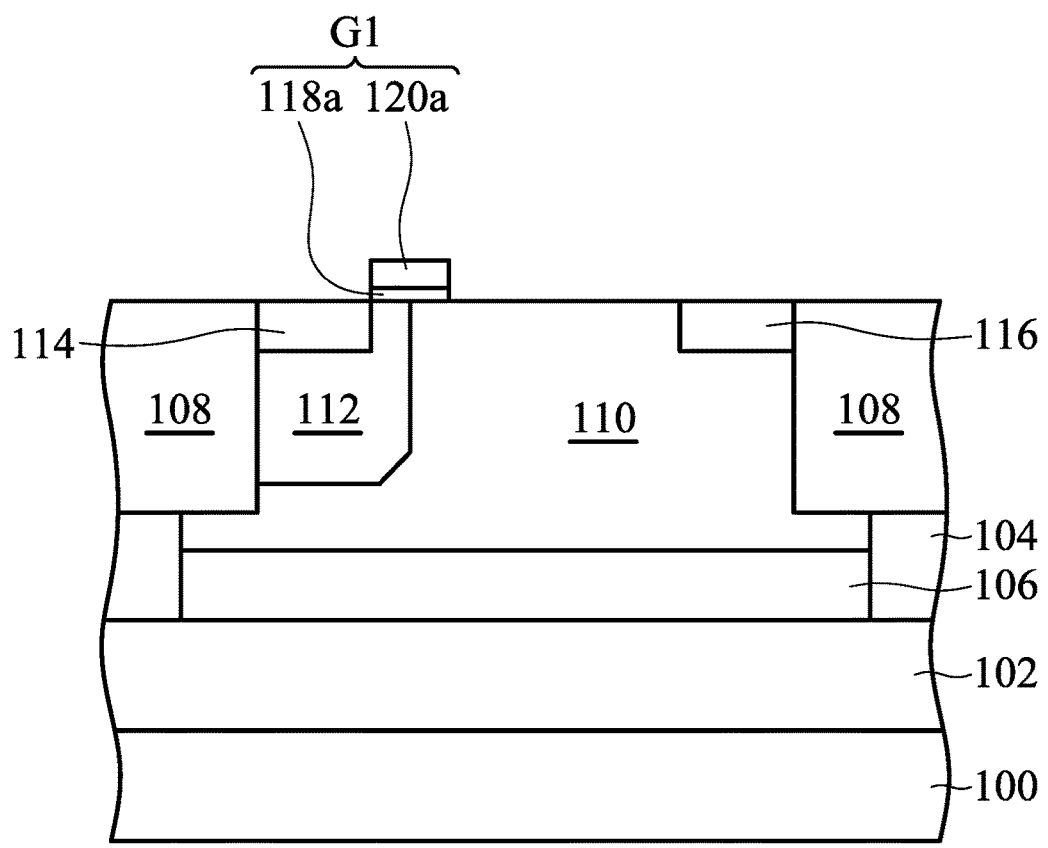
FIGS. 1-6 are schematic cross-sectional views showing an intermediate stage of a method for forming a semiconductor device in accordance with some embodiments of the disclosure.

In FIG. 1, a semiconductor substrate 100 is provided. As shown in FIG. 1, the semiconductor substrate 100 comprises a silicon substrate or a SiGe substrate. In some embodiments, the semiconductor substrate 100 comprises a bulk semiconductor substrate, a strained semiconductor substrate or a compound semiconductor substrate. The semiconductor substrate 100 may have a first conductivity type such as P-type. An isolation element 108 is respectively disposed in opposite end portions of the semiconductor substrate 100 to define an active region for the semiconductor device 500a formed thereon. The isolation elements 108 can be the shallow trench isolation (STI) elements shown in FIG. 1, but are not limited thereto. In some embodiments, the isolation elements 108 can be field oxide (FOX) isolation elements. The isolation elements 108 may comprise insulating materials such as silicon oxides, but they are not limited thereto.

As shown in FIG. 1, a doped buried region 102 is formed in a portion of the semiconductor substrate 100 underlying the isolation elements 108. The doped buried region 102 may have a second conductive type that is the opposite of the first conductivity type, for example N-type. Moreover, a well doped region 104 is formed between the doped buried region 102 and each of the isolation elements 108. A well doped region 106 is formed in a portion of the semiconductor substrate 100 between the well doped regions 104, and is above the doped buried region 102. The well doped regions 104 and the well doped region 106 may have the first conductivity type, for example P-type. A well doped region 110 is formed in the semiconductor substrate 100 between the isolation elements 108, the well doped region 106 and the well doped regions 104. A top surface 140 of the well doped region 110 is also located on the top surface of the semiconductor substrate 100. The well doped region 110 may have the second conductive type, for example N-type. A well doped region 112 is formed on a portion of the well doped region 110 and is adjacent to the one isolation element 108. Also, the well doped region 112 is surrounded by the well doped region 110 and the isolation element 108. The well doped region 112 may have the first conductivity type, for example P-type.

As shown in FIG. 1, a doped region 114 is formed in a portion of the well doped region 112, and may have the second conductivity type, for example N-type. Another doped region 116 is formed in a portion of the well doped region 110, and is adjacent to the right isolation element 108. The doped region 116 may have the second conductivity type, for example N-type. The doped region 114 and the doped region 116 may have a doping concentration greater than that of the well doped region 110. In some embodiments, the doped region 114 and the doped region 116 respectively serve as a source doped region and a drain doped region of the semiconductor device 500a.

A gate structure G1 is formed on the well doped region 110. The gate structure G1 is formed covering a portion of the well doped region 112 and a portion of the well doped region 110. Also, the gate structure G1 is positioned adjacent to the doped region 114.

The gate structure G1 comprises a dielectric layer 118a and a conductive layer 120a formed over the dielectric layer 118a. In some embodiments, the gate dielectric layer 118a may comprise silicon oxide, silicon nitride or the like, and may have a thickness of about 23-140 Å. The conductive layer 120a may comprise conductive materials such as polysilicon, metal or the like, and may have a thickness of about 800-2000 Å. In some embodiments, the gate dielectric layer 118a is formed by a dielectric material deposition process and a subsequent patterning process. The conductive layer 120a is formed by a conductive material deposition process and the subsequent patterning process.

Figure 2:
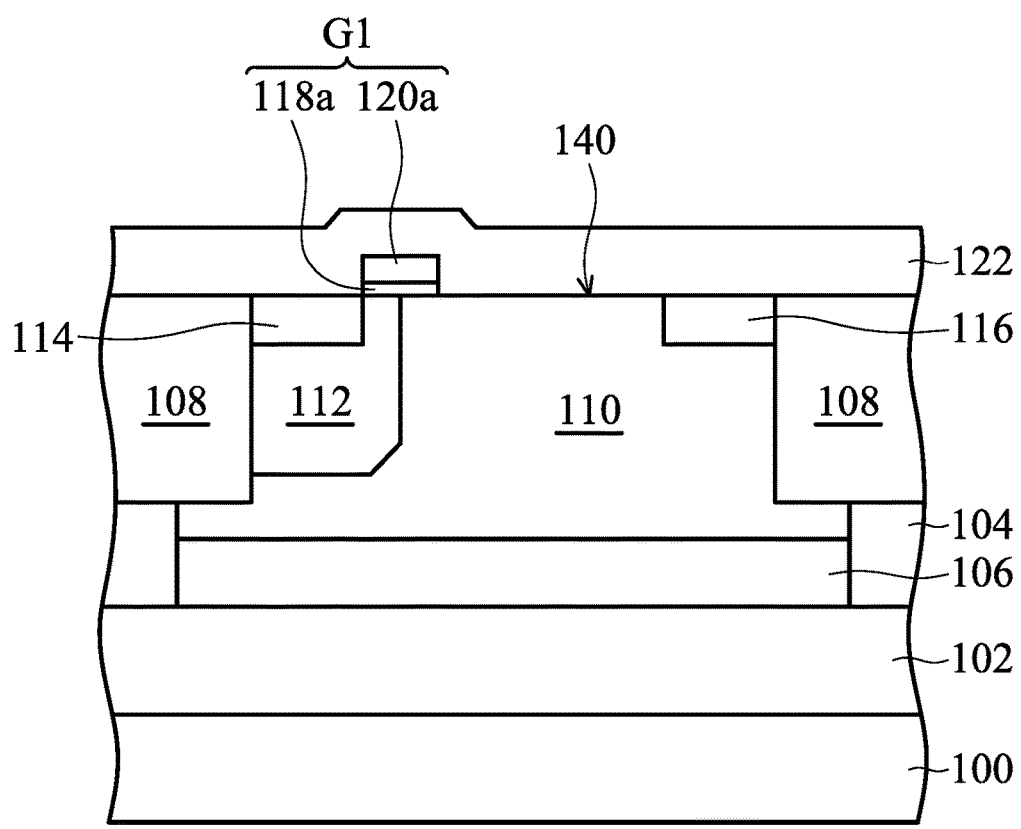

Next, a dielectric layer 122 is conformably and entirely formed on the well doped region 110. The dielectric layer 122 blanketly covers a top surface 140 of the well doped region 110 and the gate structure G1, as shown in FIG. 2. Also, the dielectric layer 122 is in contact with the gate structure G1 (including the gate dielectric layer 118a and the conductive layer 120a). In some embodiments, the dielectric layer 122 may comprise silicon oxide, silicon nitride or the like, and may have a thickness of about 200-1200 Å. The dielectric layer 122 may be thicker than the dielectric layer 118a. In some embodiments, the dielectric layer 122 may serve as a resist-protection-oxide (RPO) layer. The RPO layer is used to cover a silicide-forbidden area of the active region, which avoided having silicide formed thereon, during the silicidation process.

Figure 3:
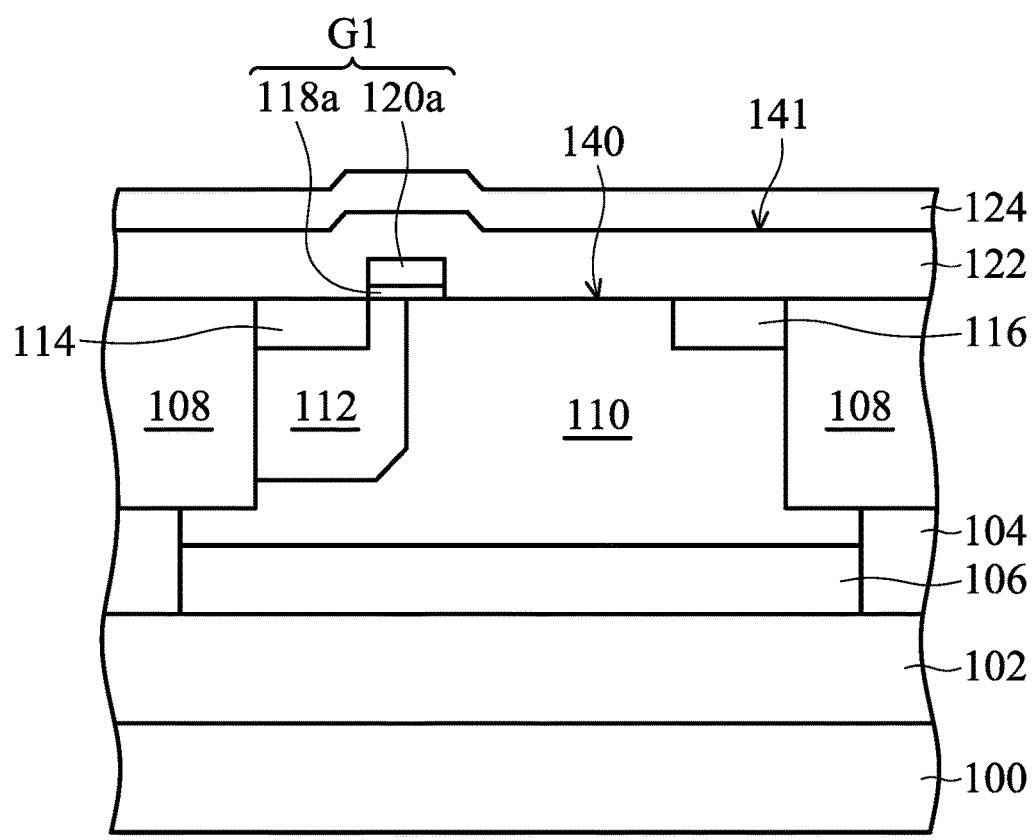

Next, a conductive layer 124 is conformably and entirely formed on the dielectric layer 122. The conductive layer 124 blanketly covers a top surface 141 of the dielectric layer 122, as shown in FIG. 3. In some embodiments, the conductive layer 124 may comprise conductive materials such as polysilicon, metal or the like, and may have a thickness of about 300-2000 Å. The conductive layer 124 may be thicker than the conductive layers 120a and 120b.

Figure 4:
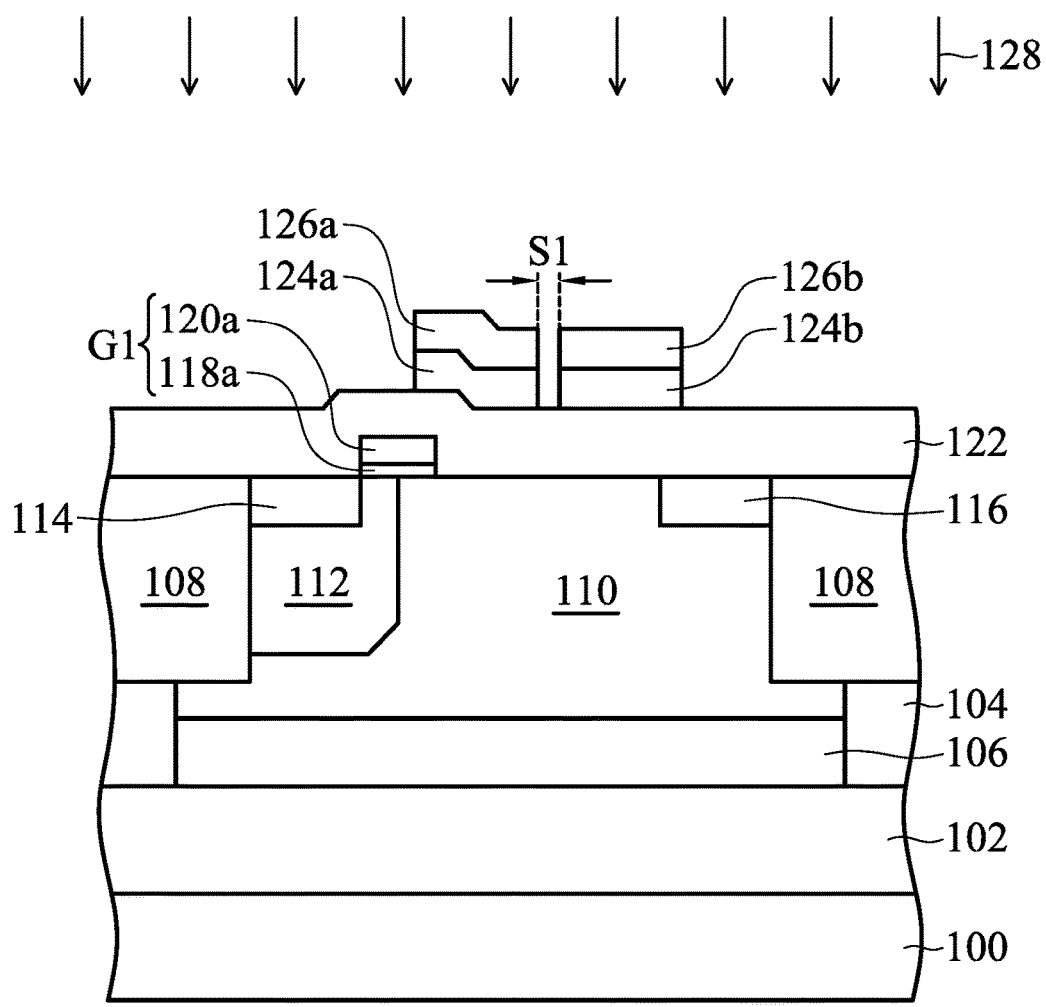

Next, a patterned mask layer 126a and a patterned mask layer 126b, which is beside the patterned mask layer 126a, as shown in FIG. 4 are formed over a portion of conductive layer 124 (see FIG. 3). In some embodiments, the patterned mask layers 126a and 126b are formed by using a mask for patterning a resist-protection-oxide (RPO) layer. An etching process 128 is then performed to remove portions of the conductive layer 124 not covered by the patterned mask layers 126a and 126b. As shown in FIG. 4, the patterned mask layers 126a and 126b may comprise materials such as photoresists or the like, and the etching process 128 can be, for example, a dry etching process. The etching process 128 stops on the dielectric layer 122, thereby forming patterned conductive layers 124a and 124b. The patterned conductive layers 124a and 124b are formed overlapping a portion of the gate structure G1. Also, the patterned conductive layers 124a and 124b are formed covering the well doped region 110 between the gate structure G1 and the second doped region 116. In some embodiments, a spacing S1 between the patterned mask layers 126a and 126b may be greater than or equal to a minimum spacing value for the design rule of the RPO layer.

Figure 5:
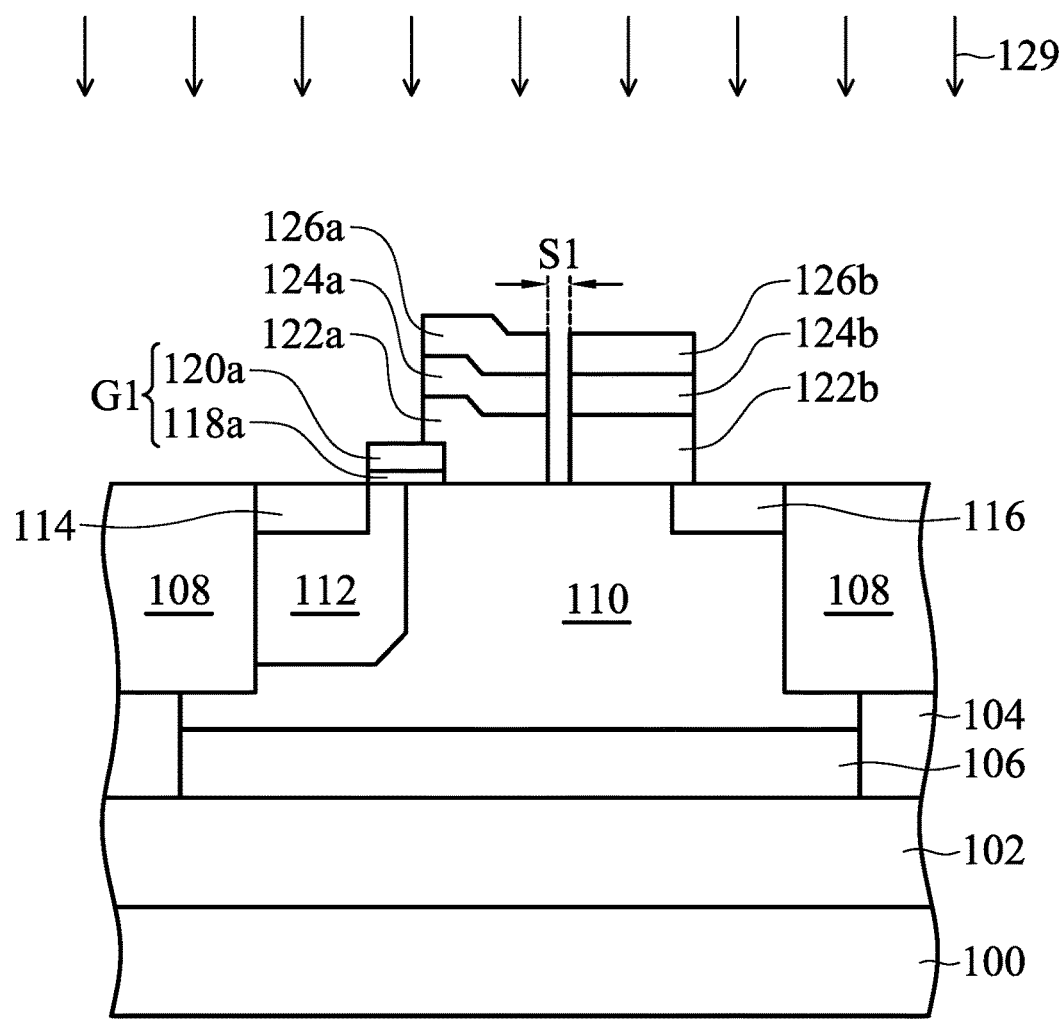

Next, another etching process 129 is performed to remove portions of the dielectric layer 122 (see FIG. 4) not covered by the patterned mask layers 126a and 126b as shown in FIG. 5. The etching process 129 can be, for example, a dry etching process. As shown in FIG. 5, the etching process 129 stops on the conductive layer 120a and the semiconductor substrate 100, thereby respectively forming a patterned dielectric layer 122a and a patterned dielectric layer 122b. The patterned dielectric layer 122a is formed under the patterned conductive layer 124a. Also, the patterned dielectric layer 122a is formed over a portion of the gate structure G1, a portion of the gate structure G2 and a portion of the top surface 140 of the well doped region 110 close to the gate structure G1. Similarly, the patterned dielectric layer 122b, which is beside the patterned dielectric layer 122a, is formed under the patterned conductive layer 124b, which is beside the patterned conductive layer 124a. Also, the patterned dielectric layer 122b is formed on the top surface 140 of the well doped region 110 between the patterned dielectric layer 122a and the doped region 116.

Figure 6:
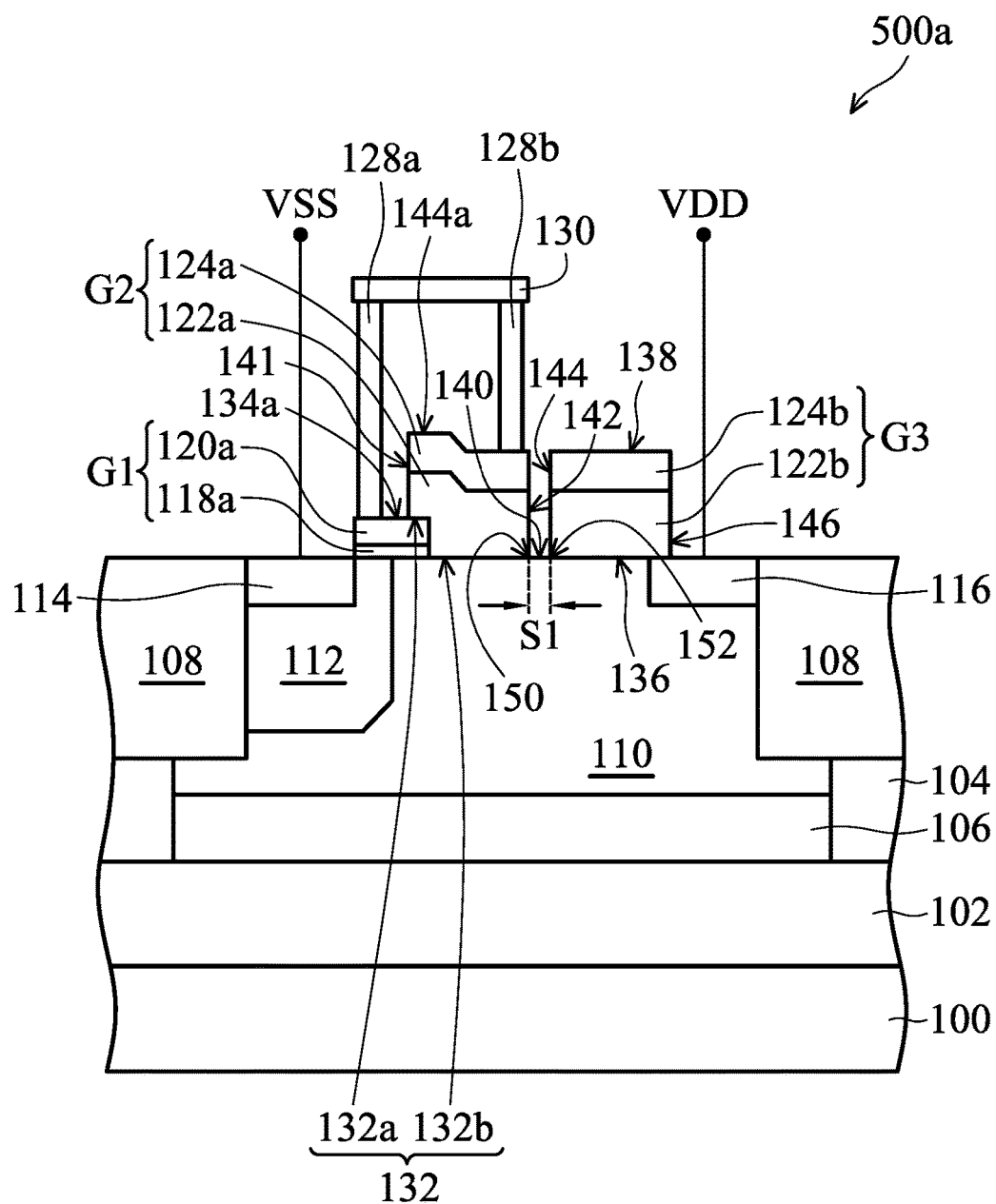

As shown in FIG. 6, after removal the patterned mask layers 126a and 126b (shown in FIG. 5), a gate structure G2 and a gate structure G3 are simultaneously formed on the top surface 140 of the well doped region 110 and within the first well doped region 110. After the aforementioned processes, the semiconductor device 500a is formed.

In some embodiments, the gate structure G2 includes the patterned conductive layer 124a and the patterned dielectric layer 122a. The gate structure G2 is formed overlapping the portion of a top surface 134a of the gate structure G1 and a portion of the first well doped region 110. Also, the gate structure G2 is formed overlapping a portion of the top surface 140 of the semiconductor substrate 100 close to the gate structure G1. A patterned dielectric layer 122a of the gate structure G2 is in contact with the conductive layer 118a of the gate structure G1. In some embodiments, the gate structure G2 may serve as a field-plate gate structure of the semiconductor device 500a.

In some embodiments, a first portion 132a of a bottom surface 132 of the gate structure G2 is in contact with the top surface 134a of the gate structure G1. In other words, the first bottom surface 132a of the gate structure G2 is aligned to the top surface 134a of the gate structure G1. A second portion 132b of the bottom surface 132 of the gate structure G2 is in contact with the top surface 140 of the well doped region 110. Also, the top surface 134a of the gate structure G1 is not coplanar with a top surface 144a of the gate structure G2. In some embodiments, the gate structure G2 covers a portion of about 20%-80% of the top surface 134a of the underlying gate structure G1 comprising the conductive layer 120a and the dielectric layer 118a.

In some embodiments, the gate structure G2 comprises a first sidewall 141 and a second sidewall 142 opposite to the first sidewall 141. The first sidewall 141, which is close to the gate structure G1, is located directly on the top surface 134a of the gate structure G1, and the second sidewall 142, which is away the gate structure G1, extends below the top surface 134a of the gate structure G1, as shown in FIG. 6.

In some embodiments, the gate structure G3 may also serve as a field-plate gate structure of the semiconductor device 500a. The gate structure G3 includes the patterned conductive layer 124b and the patterned dielectric layer 122b. The gate structure G3 is formed beside the gate structure G2 and close to the doped region 116. In this embodiment, the gate structure G3 is formed adjacent to the doped region 116, without covering any gate structure. The gate structure G3 has a planar top surface 138 and a planar bottom surface 136. In this embodiment, the top surface 134a of the gate structure G1 is positioned between the planar top surface 138 and the planar bottom surface 136 of the gate structure G3 along a direction which is substantially perpendicular to the top surface 140 of the well doped region 110.

As shown in FIG. 6, the gate structure G3 has a third sidewall 144 and a fourth sidewall 146 opposite to the third sidewall 144. The third sidewall 144 of the gate structure G3 is formed close to the second sidewall 142 and extending below the top surface 134a of the gate structure G1. The fourth sidewall 146 is formed adjacent to the second doped region 116 and extends below the top surface 134a of the gate structure G1.

As shown in FIG. 6, a spacing between the gate structure G2 and the gate structure G3 is substantially the same as the spacing S1. In some embodiments, the spacing S1 between the gate structure G2 and the gate structure G3 is designed to be small enough to avoid having any silicide formed therein. Therefore, the minimum of the spacing S1 is the same as the minimum spacing of the RPO layer defined in the design rule. In some embodiments, the spacing S1 may be in a range of about 0.4 μm~0.8 μm. In some other embodiments, the spacing S1 may be in a range of about 0.5 μm~0.6 μm. Therefore, the top surface 140 of the well doped region 110 between the gate structure G2 and the gate structure G3 (exposed from the spacing S1) avoids having any gate structure and silicide formed thereon. In other words, the spacing S1 is small enough so that no silicide can be formed between the second sidewall 142 of the gate structure G2 and the third sidewall 144 of the gate structure G3. Therefore, no dummy gate structure is required to be formed covering the bottom of the spacing S1.

It should be noted that the second portion 132b of the bottom surface 132 of the gate structure G2 is formed without covering any dummy gate structure. The planar bottom surface 136 of the gate structure G3 is formed without covering any dummy gate structure. Therefore, a bottom corner 150 of the gate structure G2 and a bottom corner 152 of the gate structure G3 close to the bottom corner 150 are positioned lower than a top surface of the gate structure.

Although the top surface 140 of the well doped region 110 between the doped region 114 and the doped region 116 (also serves as a top surface of a channel region of the semiconductor device 500a) is partially covered by the gate structure G1, the gate structure G2 and the gate structure G3, the small spacing S1 between the gate structure G2 and the gate structure G3 can prevent the silicide from forming on the top surface 140 of the well doped region 110 (exposed from the spacing S1). That is to say, the top surface 140 of the the well doped region 110 between the doped region 114 and the doped region 116 can avoid having any silicide formed thereon.

As shown in FIG. 6, for the ease of illustrating the electrical potential provided to the semiconductor device 500a, conductive contacts 128a and 128b and a conductive line 130 can be further provided to the semiconductor device 500a. The conductive contact 128a is connected to the conductive layer 120a of the gate structure G1. The conductive contact 128b is connected to the conductive layer 124a of the gate structure G2. In some embodiments, the conductive contacts 128a and 128b are both connected the conductive line 130, so that the gate structure G2 is electrically coupled to the gate structure G1. The gate structure G2, which comprises the patterned conductive layer 124a and the patterned dielectric layer 122a, and the gate structure G1, which comprises the conductive layer 120a and the dielectric layer 118a, may be provided with the same electrical potential during operations. The gate structure G1 and the gate structure G2 may be combined to function as a combined gate structure of the semiconductor device 500*a* capable of high-voltage operations. Therefore, the gate structure G2 may serve as an extended gate structure to reduce the surface electric field and to increase the on-state current of the semiconductor device 500*a*.

In some other embodiments, the gate structure G2 is electrically coupled to the doped region 114 (i.e. the source doped region of the semiconductor device 500*a*) rather than to the gate structure G1. In other words, the gate structure G2 is electrically coupled to the reference potential VSS to increase the switching speed of the semiconductor device 500*a*.

In some embodiments, the conductive contacts 128*a* and 128*b* may comprise conductive materials such as tungsten, copper or the like, and the conductive line 130*a* may comprise materials such as tungsten, copper or the like.

In some embodiments, the gate structure G3 is electrically floating. In other words, the gate structure G3 is electrically isolated from the gate structure G1, the (field plate) gate structure G2, the first doped region 114 and the second doped region 116. Therefore, the gate structure G3 (the field plate gate structure) may serve as a dummy gate structure. Also, the doped region 114, which serves as the source doped region of the semiconductor device 500*a*, is electrically coupled to the reference potential VSS. The doped region 116, which serves as the drain doped region of the semiconductor device 500*a*, is electrically coupled to a drain supply voltage VDD.

In this embodiment, the gate structure G2 is pulled away from the doped region 116 (the drain doped region) by the gate structure G3 to improve the breakdown voltage of the of the semiconductor device 500*a*. Also, the spacing S1 between the gate structure G2 and the gate structure G3 is designed to be small enough to prevent the undesired silicide from being formed on the channel region between the doped region 114 and the doped region 116.

Figure 7:
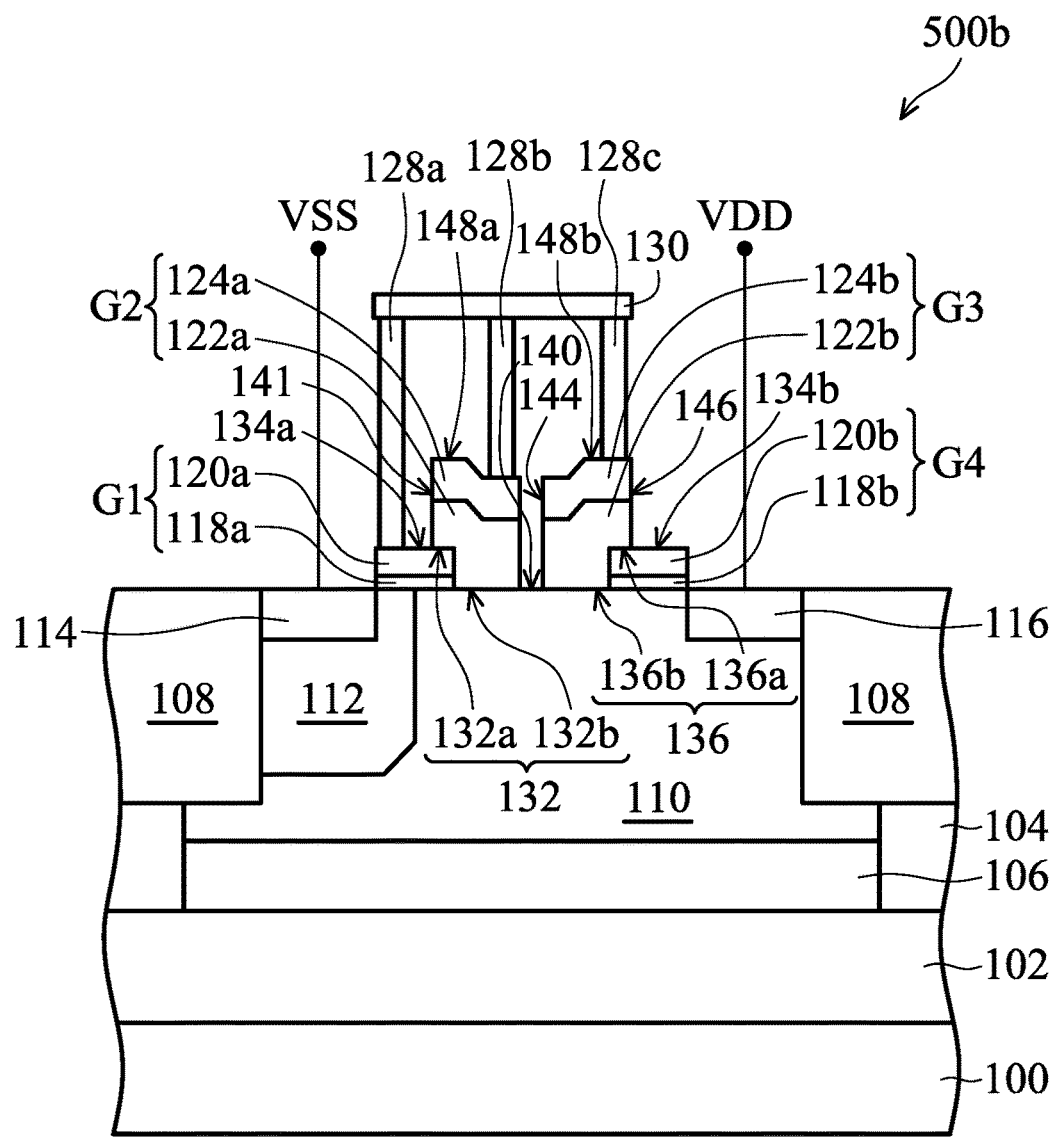
FIG. 7 is a cross-sectional view of a semiconductor device in accordance with some embodiments of the disclosure.

FIG. 7 is a cross-sectional view of a semiconductor device 500*b* in accordance with some embodiments of the disclosure. Elements of the embodiments hereinafter that are the same or similar as those previously described with reference to FIGS. 1-6, are not repeated for brevity. One of the differences between the semiconductor device 500*a* and the semiconductor device 500*b* is that the semiconductor device 500*b* further includes a gate structure G4 formed beside the gate structure G1 and adjacent to the doped region 114. In other words, the gate structure G4 is covered by the gate structure G3 and extending to the second doped region 116. The gate structure G3 covers a portion of the top surface 134*b* of the gate structure G4 and a portion of the top surface 140 of the well doped region 110 between the gate structure G2 and the gate structure G4.

As shown in FIG. 7, the gate structure G4 includes a dielectric layer 118*b* and a conductive layer 120*b* on the dielectric layer 118*b*. The dielectric layers 118*a* and 118*b* are formed simultaneously. Also, the conductive layers 120*a* and 120*b* are formed simultaneously. Therefore, the top surface 134*b* of gate structure G4 is coplanar with the top surface 134*a* of the gate structure G1.

In some embodiments, as shown in FIG. 7, the gate structure G3 may also serve as a field-plate gate structure of the semiconductor device 500*b*. The bottom surface 136 of the gate structure G3 has two portions in different levels (not coplanar with each other). A first portion 136*a* of the bottom surface 136 of the gate structure G3 is in contact with the top surface 134*b* of the gate structure G4. In other words, the first portion 136*a* of the bottom surface 136 of the gate structure G3 is aligned to the top surface 134*b* of the gate structure G4. A second portion 136*b* of the bottom surface 136 of the gate structure G3 is in contact with the top surface 140 of the well doped region 110.

As shown in FIG. 7, the third sidewall 144 of the gate structure G3 is formed close to the second sidewall 142 and extending below the top surface 134*a* of the gate structure G1. The fourth sidewall 146 is formed close to the second doped region 116 and is located directly on the top surface 134*b* of the gate structure G4.

Also, the top surface 134*b* of the gate structure G4 is not coplanar with a top surface 148*b* of the gate structure G3. In some embodiments, the gate structure G3 covers a portion of about 20%-80% of the top surface 134*ba* of the underlying gate structure G4 comprising the conductive layer 120*b* and the dielectric layer 118*b*.

Although the top surface 140 of the well doped region 110 between the doped region 114 and the doped region 116 (also serves as a top surface of a channel region of the semiconductor device 500*a*) is partially covered by the gate structure G1, the gate structure G2, the gate structure G3 and the gate structure G4, the small spacing S1 between the gate structure G2 and the gate structure G3 can prevent the silicide from forming on the top surface 140 of the well doped region 110 (exposed from the spacing S1) of the semiconductor device 500*b* as shown in FIG. 7.

As shown in FIG. 7, in some embodiments, the gate structure G3 serving as a field plate gate structure is electrically coupled to the gate structure G1 and the gate structure G2 through the conductive contacts 128*a*, 128*b* and 128*c* and the conductive line 130. The gate structure G1, the gate structure G2 and the gate structure G3 may be combined to function as a combined gate structure of the semiconductor device 500*b* capable of high-voltage operations. Therefore, the gate structure G2 and the gate structure G3 may serve as extended gate structures to increase the on-state current of the semiconductor device 500*b*.

In some other embodiments, the gate structure G2 and the gate structure G3 are electrically coupled to the doped region 114 (i.e. the source doped region of the semiconductor device 500*a*) rather than to the gate structure G1. In other words, the gate structure G2 and the gate structure G3 are electrically coupled to the reference potential VSS to increase the switching speed of the semiconductor device 500*b*.

In some embodiments, the gate structure G4 is electrically floating. Therefore, the gate structure G4 may serve as a dummy gate structure. Also, the doped region 114, which serves as the source doped region of the semiconductor device 500*b*, is electrically coupled to the reference potential VSS. The doped region 116, which serves as the drain doped region of the semiconductor device 500*b*, is electrically coupled to a drain supply voltage VDD.

In this embodiment, the gate structure G3 is pulled away from the doped region 116 (the drain doped region) by the formation of the gate structure G4, which serves as dummy gate structure, to improve the breakdown voltage of the of the semiconductor device 500*b*. The small spacing S1 between the gate structure G2 and the gate structure G3 can prevent the silicide from forming on the top surface 140 of the well doped region 110 (exposed from the spacing S1) even though there is no dummy gate structure covering the top surface 140 of the semiconductor substrate 100 exposed from the spacing S1.

Embodiments provide semiconductor devices 500*a* and 500*b*. The semiconductor device may include a power metal-oxide-semiconductor (MOS) transistor. The semiconductor device uses at least two field plate gate structures close to each other to extend a lateral distance between a gate structure and a drain doped region of the power MOS transistor. The lateral distance is along a direction substantially parallel to a top surface of a well doped region 110. The spacing between the two field plate gate structures is designed to be small enough to avoid having any silicide formed in the spacing. Therefore, no dummy gate structure is required to be formed covering the bottom of the spacing. The field plate gate structure close to the source doped region overlaps a portion of a gate structure of the power MOS transistor and electrically connects to the gate structure of the power MOS. Therefore, the field plate gate structure close to the source doped region and the gate structure can serve as a combined gate structure. In some embodiments, the field plate gate structure close to the drain doped region can be electrically floating (i.e. electrically isolated form other components of the power MOS transistor). The field plate gate structure and the dummy poly gate structure may be formed simultaneously. The field plate gate structure and the dummy poly gate structure are composed of a resist-protection-oxide (RPO) pattern and a conductive layer pattern on the RPO pattern.

In some embodiments, the field plate gate structure close to the drain doped region can be electrically coupled to the gate structure and separated from the drain doped region by an additional dummy gate structure. Therefore, the two field plate gate structures and the gate structure can serve as a combined gate structure. The additional dummy gate structure is electrically floating (i.e. electrically isolated form other components of the power MOS transistor). Therefore, the field plate gate close to the drain doped region can be electrically coupled to the gate voltage and pulled away from the drain doped region, which is electrically coupled to a high operation voltage.

Through the use of the combined gate structure shown in FIG. 6 and FIG. 7, a more uniform electric field contribution can be observed in a channel region (a region between a source doped region and the drain doped region) underlying the combined gate structure during the operation of the semiconductor devices 500a and 500b. Also, the combined gate structure is pulled away from the drain doped region by the formation of the dummy gate structure to improve the breakdown voltage of the of the semiconductor device. The dummy gate structure is formed to prevent the undesired silicide from being formed on the channel region between the combined gate structure and the drain doped region of the semiconductor device. Accordingly, the semiconductor devices 500a and 500b capable of high-voltage operation shown in FIG. 6 and FIG. 7 can operate at a higher voltage of about 9-100 volts.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a semiconductor substrate having a first conductivity type;
    a first well doped region formed in a portion of the semiconductor substrate, having a second conductivity type that is the opposite of the first conductivity type;
    a first doped region formed on the first well doped region, having the second conductivity type;
    a second doped region formed on the first well doped region and separated from the first doped region, having the second conductivity type;
    a first gate structure formed over the first well doped region and adjacent to the first doped region;
    a second gate structure overlapping a portion of the first gate structure and a portion of the first well doped region; and
    a third gate structure formed beside the second gate structure and adjacent to the second doped region, wherein the second gate structure and the third gate structure are formed directly on a top surface of the first well doped region and are spaced apart by a spacing that exposes the top surface of the first well doped region, wherein the spacing between the second gate structure and the third gate structure on the top surface is in a range of 0.4 micron to 0.8 micron and wherein said spacing avoids silicide formation on the top surface of the first well doped region between the second gate structure and the third gate structure.

2. The semiconductor device as claimed in claim 1, wherein a top surface of the first gate structure is between a planar top surface and a planar bottom surface of the third gate structure.

3. The semiconductor device as claimed in claim 1, further comprising:
    a second well doped region formed in a portion of the first well doped region, having the first conductivity type, wherein the first doped region is formed in a portion of the second well doped region, and
    wherein the first gate structure is formed overlapping both a portion of the second well doped region and a portion of the first well doped region.

4. The semiconductor device as claimed in claim 1, wherein:
    the second gate structure is electrically coupled to the first gate structure;
    the third gate structure is electrically floating;
    the first doped region is electrically coupled to a reference potential (VSS); and
    the second doped region is electrically coupled to a drain supply voltage (VDD).

5. The semiconductor device as claimed in claim 4, wherein the third gate structure is formed without covering any gate structure.

6. The semiconductor device as claimed in claim 1, wherein the second gate structure has a first bottom surface, which is in contact with the first gate structure, and a second bottom surface, which is aligned to a bottom surface of the third gate structure.

7. The semiconductor device as claimed in claim 6, wherein the first bottom surface of the second gate structure is aligned to the top surface of the first gate structure.

8. The semiconductor device as claimed in claim 6, further comprising:
    a fourth gate structure formed beside the first gate structure and adjacent to the second doped region,
    wherein the third gate structure overlaps a portion of the fourth gate structure.

9. The semiconductor device as claimed in claim 8, wherein:
    the second gate structure is electrically coupled to the first gate structure;
    the third gate structure is electrically coupled to the first gate structure;

the fourth gate structure is electrically floating;
the first doped region is electrically coupled to a reference potential (VSS); and
the second doped region is electrically coupled to a drain supply voltage (VDD).

10. The semiconductor device as claimed in claim 9, wherein the third gate structure has a third bottom surface, which is in contact with the fourth gate structure and aligned to the first bottom surface, and a fourth bottom surface, which is aligned to a bottom surface of the fourth gate structure and the second bottom surface.

11. The semiconductor device as claimed in claim 8, wherein a top surface of the fourth gate structure is aligned to the top surface of the first gate structure.

12. A semiconductor device, comprising:
a semiconductor substrate having a first conductivity type;
a first well doped region formed in a portion of the semiconductor substrate, having a second conductivity type that is the opposite of the first conductivity type;
a first doped region formed on the first well doped region, having the second conductivity type;
a second doped region formed on the first well doped region and separated from the first doped region, having the second conductivity type;
a first gate structure formed over the first well doped region and adjacent to the first doped region;
a second gate structure overlapping a portion of the first gate structure; and
a third gate structure formed beside the second gate structure and adjacent to the second doped region,
wherein the second gate structure has a first sidewall and a second sidewall opposite to the first sidewall, wherein the first sidewall is positioned directly on a top surface of the first gate structure, and the second sidewall extends below the top surface of the first gate structure, wherein the second gate structure and the third gate structure are formed directly on a top surface of the first well doped region and are spaced apart by a spacing that exposes the top surface of the first well doped region, wherein the spacing between the second gate structure and the third gate structure on the top surface is in a range of 0.4 micron to 0.8 micron and wherein said spacing avoids silicide formation on the top surface of the first well doped region between the second gate structure and the third gate structure.

13. The semiconductor device as claimed in claim 12, wherein the third gate structure has a third sidewall adjacent to the second sidewall and extends below the top surface of the first gate structure.

14. The semiconductor device as claimed in claim 13, wherein no silicide is formed between the second sidewall and the third sidewall.

15. The semiconductor device as claimed in claim 13, wherein the third gate structure has a fourth sidewall opposite to the third sidewall and adjacent to the second doped region.

16. The semiconductor device as claimed in claim 15, wherein the fourth sidewall is adjacent to the second doped region and extends below the top surface of the first gate structure.

17. The semiconductor device as claimed in claim 12, wherein:
the second gate structure is electrically coupled to the first gate structure;
the third gate structure is electrically floating;
the first doped region is electrically coupled to a reference potential (VSS); and
the second doped region is electrically coupled to a drain supply voltage (VDD).

18. The semiconductor device as claimed in claim 15, further comprising:
a fourth gate structure formed beside the first gate structure and adjacent to the second doped region,
wherein the fourth sidewall of the fourth gate structures directly on a top surface of the fourth gate structure.

19. The semiconductor device as claimed in claim 18, wherein:
the second gate structure is electrically coupled to the first gate structure;
the third gate structure is electrically coupled to the first gate structure;
the fourth gate structure is electrically floating;
the first doped region is electrically coupled to a reference potential (VSS); and
the second doped region is electrically coupled to a drain supply voltage (VDD).

20. A semiconductor device, comprising:
a semiconductor substrate having a first conductivity type;
a first well doped region formed in a portion of the semiconductor substrate, having a second conductivity type that is the opposite of the first conductivity type;
a source doped region formed on the first well doped region, having the second conductivity type;
a drain doped region formed on the first well doped region and separated from the first doped region, having the second conductivity type;
a gate structure formed on the first well doped region and adjacent to the source doped region;
a first field plate gate structure formed covering and electrically coupled to the gate structure; and
a second field plate gate structure separated from the first field plate gate structure and adjacent to the drain doped region,
wherein the first field plate gate structure has a first bottom corner that is adjacent to the second field plate gate structure and lower than a top surface of the gate structure wherein the first field plate gate structure and the second field plate gate structure are formed directly on a top surface of the first well doped region and are spaced apart by a spacing that exposes the top surface of the first well doped region, wherein the spacing between the first field plate gate structure and the second field plate gate structure is in a range of 0.4 micron to 0.8 micron and wherein said spacing avoids silicide formation on the top surface of the first well doped region between the first field plate gate structure and the second field plate gate structure.

21. The semiconductor device as claimed in claim 20, wherein the second field plate gate structure has a second bottom corner that is adjacent to and aligned with the first bottom corner, wherein the first bottom corner and the second bottom corner are not in contact with any silicide.

22. The semiconductor device as claimed in claim 20, wherein the second field plate gate structure is electrically isolated form the gate structure, the first field plate gate structure, the first doped region and the second doped region.

23. The semiconductor device as claimed in claim 21, further comprising:
a dummy gate structure covered by the second field plate gate structure and extending to the second doped region, wherein a top surface of the dummy gate structure is aligned to the top surface of the gate structure.

24. The semiconductor device as claimed in claim 23, wherein:
  the first field plate gate structure is electrically coupled to the gate structure;
  the second field plate gate structure is electrically coupled to the gate structure;
  the dummy gate structure is electrically floating;
  the first doped region is electrically coupled to a reference potential (VSS); and
  the second doped region is electrically coupled to a drain supply voltage (VDD).

* * * * *